US012584966B2

(12) United States Patent
Park et al.

(10) Patent No.: US 12,584,966 B2
(45) Date of Patent: Mar. 24, 2026

(54) APPARATUS AND METHOD FOR MANAGING BATTERY

(71) Applicant: LG ENERGY SOLUTION, LTD., Seoul (KR)

(72) Inventors: Tae-Soon Park, Daejeon (KR); Ji-Su An, Daejeon (KR); Ji-Eun Lee, Daejeon (KR); Dong-In Choi, Daejeon (KR); Suk-Hyun Kang, Daejeon (KR); Ho-Young Kim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 0 days.

(21) Appl. No.: 19/035,625

(22) Filed: Jan. 23, 2025

(65) Prior Publication Data

US 2025/0237705 A1     Jul. 24, 2025

(30) Foreign Application Priority Data

Jan. 23, 2024     (KR) ........................ 10-2024-0010153

(51) Int. Cl.
*G01R 31/367*     (2019.01)
*G01R 31/388*     (2019.01)
*G01R 31/389*     (2019.01)

(52) U.S. Cl.
CPC ......... *G01R 31/367* (2019.01); *G01R 31/388* (2019.01); *G01R 31/389* (2019.01); *H01M 2220/20* (2013.01)

(58) Field of Classification Search
CPC .. G01R 31/367; G01R 31/388; G01R 31/389; H01M 2220/20

USPC .......................................................... 320/149
See application file for complete search history.

(56) References Cited

U.S. PATENT DOCUMENTS

| | | | | |
|---|---|---|---|---|
| 5,563,496 A * | 10/1996 | McClure | ............... | H02M 7/217 |
| | | | | 320/128 |
| 7,400,113 B2 * | 7/2008 | Osborne | ............... | H02J 7/0018 |
| | | | | 320/118 |
| 7,548,821 B2 * | 6/2009 | Tae | ....................... | G01R 31/389 |
| | | | | 702/63 |
| 11,105,861 B2 * | 8/2021 | Seo | ...................... | G01R 31/388 |
| 11,876,191 B2 * | 1/2024 | Cha | ....................... | H01M 10/48 |
| 12,184,107 B2 * | 12/2024 | Yamaguchi | ........... | H02J 7/0048 |

(Continued)

FOREIGN PATENT DOCUMENTS

| | | | | |
|---|---|---|---|---|
| CN | 108896917 A | 11/2018 | | |
| CN | 113093017 A * | 7/2021 | ........... | G01R 31/388 |

(Continued)

*Primary Examiner* — M Baye Diao
(74) *Attorney, Agent, or Firm* — BRYAN CAVE LEIGHTON PAISNER LLP

(57)     ABSTRACT

A battery managing apparatus according to an embodiment of the present disclosure includes a measurement unit configured to measure the voltage of a battery that is charged by repeating a charging period and a resting period; and a control unit configured to calculate a resistance corresponding to each of a plurality of resting periods, generate a first profile indicating a correspondence relationship between a state of charge (SOC) and the resistance of the battery, divide an SOC section of the first profile into a plurality of unit sections, and calculate a summed resistance of the battery based on a weight and a reference resistance corresponding to each of the plurality of unit sections.

12 Claims, 9 Drawing Sheets

(56)          References Cited

U.S. PATENT DOCUMENTS

| | | | | |
|---|---|---|---|---|
| 12,345,773 B2 * | 7/2025 | Lee | G01R 31/367 | |
| 2016/0159218 A1 * | 6/2016 | Kang | B60K 35/654 | |
| | | | 701/36 | |
| 2019/0135128 A1 | 5/2019 | Kim | | |
| 2020/0200829 A1 | 6/2020 | Lee | | |
| 2021/0396810 A1 | 12/2021 | Lee et al. | | |
| 2023/0178818 A1 * | 6/2023 | Jeong | H01M 10/052 | |
| | | | 429/61 | |
| 2023/0238815 A1 | 7/2023 | Kwak et al. | | |
| 2023/0296688 A1 | 9/2023 | Kim et al. | | |
| 2024/0396351 A1 * | 11/2024 | Yu | G01R 31/389 | |
| 2025/0130283 A1 | 4/2025 | Choi et al. | | |
| 2025/0138102 A1 * | 5/2025 | Woo | G01R 31/392 | |

FOREIGN PATENT DOCUMENTS

| | | | | |
|---|---|---|---|---|
| EP | 4564029 A1 * | 6/2025 | | G01R 31/374 |
| KR | 1020160080802 A | 7/2016 | | |
| KR | 1020170139968 A | 12/2017 | | |
| KR | 101912615 B1 | 10/2018 | | |
| KR | 1020190044399 A | 4/2019 | | |
| KR | 1020190050637 A | 5/2019 | | |
| KR | 10-2020-0077238 A | 6/2020 | | |
| KR | 20200077238 A | 6/2020 | | |
| KR | 1020200064751 A | 6/2020 | | |
| KR | 1020200090044 A | 7/2020 | | |
| KR | 10-2022-0012003 A | 2/2022 | | |
| KR | 20220012003 A | 2/2022 | | |
| KR | 10-2022-0072578 A | 6/2022 | | |
| KR | 20220072578 A | 6/2022 | | |
| KR | 10-2022-0131703 A | 9/2022 | | |
| KR | 20220131703 A | 9/2022 | | |
| KR | 1020220139755 A | 10/2022 | | |
| KR | 1020230060174 A | 5/2023 | | |
| KR | 1020230108663 A | 7/2023 | | |
| KR | 1020230155893 A | 11/2023 | | |
| KR | 10-2023-0171596 A | 12/2023 | | |
| KR | 20230171596 A | 12/2023 | | |

* cited by examiner

*FIG. 5*

| UNIT SECTION | ENTIRE RESISTANCE [Ω] | UNIT RESISTANCE [Ω] | WEIGHT | REFERENCE RESISTANCE [Ω] | SUMMED RESISTANCE [Ω] |
|---|---|---|---|---|---|
| R1 | | a1 | w1=a1÷A | r1 | |
| R2 | | a2 | w2=a2÷A | r2 | |
| R3 | | a3 | w3=a3÷A | r3 | |
| R4 | | a4 | w4=a4÷A | r4 | |
| R5 | A | a5 | w5=a5÷A | r5 | SR = w1×r1 + w2×r2 + . . . + w10×r10 |
| R6 | | a6 | w6=a6÷A | r6 | |
| R7 | | a7 | w7=a7÷A | r7 | |
| R8 | | a8 | w8=a8÷A | r8 | |
| R9 | | a9 | w9=a9÷A | r9 | |
| R10 | | a10 | w10=a10÷A | r10 | |

APPARATUS AND METHOD FOR MANAGING BATTERY

CROSS-REFERENCE TO RELATED APPLICATIONS

This application is based on and claims priority from Korean Patent Application No. 10-2024-0010153 filed on Jan. 23, 2024, with the Korean Intellectual Property Office, the disclosure of which is incorporated herein in its entirety by reference.

TECHNICAL FIELD

The present disclosure relates to a battery managing apparatus and method.

BACKGROUND

Recently, as the demand for portable electronic products such as notebook computers, video cameras, and portable telephones has rapidly increased, and as the development of electric vehicles, energy storage batteries, robots, and satellites has begun in earnest, research on the high-performance batteries allowing repeated charging and discharging are being actively conducted.

Currently, commercially available batteries include, for example, nickel-cadmium batteries, nickel-hydrogen batteries, nickel-zinc batteries, and lithium batteries. Of these batteries, lithium batteries are gaining considerable attention due to their advantages including a substantially low memory effect to allow a high degree of freedom in charging and discharging, a very low self-discharging rate, and high energy density, as compared to nickel-based batteries.

While many studies are being conducted on the batteries focusing on the high-capacity and the high-density, it is also important to improve the lifespan and the safety of the batteries. In order to enhance the safety of batteries, a technology which may accurately diagnose the current state of the batteries, is necessary.

SUMMARY

An embodiment of the present disclosure provides a battery managing apparatus and method capable of deriving a state indicator of a battery used to determine the state of the battery based on the resistance of the battery.

Various aspects of the present disclosure may be understood by the following description, and will be more clearly understood by embodiments of the present disclosure. In addition, it will be easily understood that various aspects of the present disclosure may be implemented by the means and combinations thereof indicated in the patent claims.

A battery managing apparatus according to one aspect of the present disclosure may include a measurement unit configured to measure the voltage of a battery that is charged by repeating a charging period and a resting period; and a control unit configured to calculate a resistance corresponding to each of a plurality of resting periods, generate a first profile indicating a correspondence relationship between a state of charge (SOC) and the resistance of the battery, divide an SOC section of the first profile into a plurality of unit sections, and calculate a summed resistance of the battery based on a weight and a reference resistance corresponding to each of the plurality of unit sections.

The control unit may be configured to calculate an entire resistance for the SOC section and a unit resistance for each of the plurality of unit sections, and calculate the weight corresponding to each of the plurality of unit sections based on the entire resistance and a plurality of calculated unit resistances.

The control unit may be configured to calculate the weight corresponding to each of the plurality of unit sections by calculating a ratio of each of the plurality of unit resistances to the entire resistance.

The control unit may be configured to select any one resistance included in each of the plurality of unit sections as the reference resistance, and calculate the summed resistance by summing a product of the reference resistance and the weight of each of the plurality of unit sections.

The control unit may be configured to compare the calculated and summed resistance with a preset threshold resistance, and diagnose a state of the battery based on a comparison result.

The control unit may be configured to calculate the summed resistance for each of a plurality of batteries, and compare a plurality of calculated summed resistances to determine relative performances of the plurality of batteries.

The control unit may be configured to calculate the plurality of summed resistances when the plurality of batteries are charged at the same Current-rate (C-rate), and compare the plurality of calculated summed resistances.

The control unit may be configured to calculate the summed resistance at each C-rate during a charging process of the battery, and generate a second profile indicating a correspondence relationship between the C-rate and the summed resistance.

The control unit may be configured to generate a second profile for each of a plurality of batteries, and compare the summed resistances at each C-rate of a plurality of second profiles to determine relative performances of the plurality of batteries.

A battery pack according to another aspect of the present disclosure may include the battery managing apparatus according to one aspect of the present disclosure.

A vehicle according to still another aspect of the present disclosure may include the battery managing apparatus according to one aspect of the present disclosure.

A battery managing method according to still another aspect of the present disclosure may include a voltage measurement step of measuring a voltage of a battery that is charged by repeating a charging period and a resting period; a resistance calculation step of calculating a resistance corresponding to each of a plurality of resting periods; a profile generation step of generating a first profile indicating a correspondence relationship between a state of charge (SOC) and the resistance of the battery; an SOC section division step of dividing an SOC section of the first profile into a plurality of unit sections; and a summed resistance calculation step of calculating a summed resistance of the battery based on a weight and a resistance corresponding to each of the plurality of unit sections.

A battery storage medium according to still another aspect of the present disclosure may be a non-transitory computer-readable storage medium having stored therein a program for executing a battery managing method, the battery managing method including: a voltage measurement step of measuring a voltage of a battery that is charged by repeating a charging period and a resting period; a resistance calculation step of calculating a resistance corresponding to each of a plurality of resting periods; a profile generation step of generating a first profile indicating a correspondence relationship between a state of charge (SOC) and the resistance of the battery; an SOC section division step of dividing an SOC section of the first profile into a plurality of unit sections; and a summed resistance calculation step of calculating a summed resistance of the battery based on a weight and a resistance corresponding to each of the plurality of unit sections.

According to one aspect of the present disclosure, since the resistance indicator of a battery is determined based on a first profile acquired during a charging process, the state of the battery may be determined in various aspects through the absolute comparison or relative comparison of the determined resistance indicator.

The effects of the present disclosure are not limited to the effects mentioned above, and other effects not mentioned will be clearly understood by those skilled in the art from the description of the claims.

BRIEF DESCRIPTION OF THE DRAWINGS

The following drawings attached to the specification serve to further understand the technical idea of the present disclosure together with the detailed description of the present disclosure described below, such that the present disclosure should not be interpreted as being limited to matters described in such drawings.

FIG. 5 is a diagram schematically illustrating an embodiment of calculating a summed resistance corresponding to the first profile.

DETAILED DESCRIPTION

Figure 1:
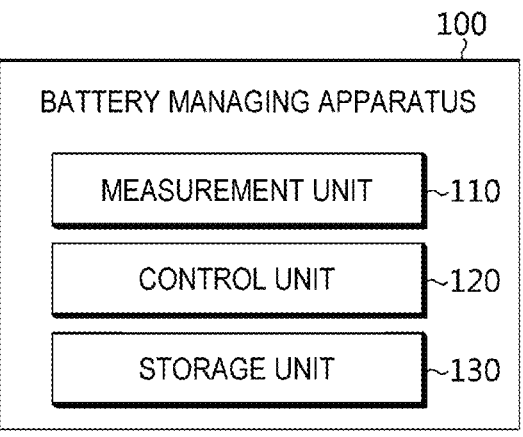
FIG. 1 is a diagram schematically illustrating a battery managing apparatus according to an embodiment of the present disclosure.

The terms and words used in the specification and claims should not be construed as being limited to their ordinary or dictionary meanings, but should be construed as meanings and concepts consistent with the technical idea of the present disclosure based on a principle that an inventor may appropriately define the concepts of terms in order to explain his or her invention in the best possible manner.

Therefore, embodiments in the specification and configurations illustrated in the drawings are merely provided as examples and do not represent all of the technical ideas of the present disclosure, so it should be understood that there may be various equivalents and modifications that could replace the technical ideas at the time of filing this application. Also, in the description of the present disclosure, when it is deemed that explanation of related well-known constructions or functions may obscure the essence of the present disclosure, the detailed description thereof is omitted.

The terms including the ordinal number such as "first", "second", and the like, may be used to distinguish one element from another element among various elements, but these terms are not intended to limit the elements.

Throughout the specification, when a portion is referred to as "comprising" or "including" any element, it means that the portion may include other elements further, without excluding other elements, unless specifically stated otherwise.

In addition, throughout the specification, when a portion is referred to as being "connected" to another portion, it is not limited to the case that they are "directly connected", but it also includes the case where they are "indirectly connected" with another element interposed therebetween.

FIG. 1 is a diagram schematically illustrating a battery managing apparatus 100 according to an embodiment of the present disclosure.

Referring to FIG. 1, the battery managing apparatus 100 may include a measurement unit 110 and a control unit 120.

The measurement unit 110 may be configured to measure the voltage of a battery that is charged by repeating a charging period and a resting period.

The battery refers to a single, physically separable independent cell including a negative terminal and a positive terminal. For example, the battery may be a lithium ion battery or a lithium polymer battery. In addition, the type of the battery may be a cylindrical type, a prismatic type, or a pouch type. In addition, the battery may mean a battery bank, a battery module or a battery pack in which a plurality of cells are connected in series and/or in parallel. Hereinafter, for the convenience of explanation, the battery is described as meaning a single independent cell.

The battery may be charged by repeating a charging period and a resting period under a certain condition. The charging period is a period of time during which the battery is charged at a predetermined Current-rate (C-rate), and the resting period is a period of time during which the charging of the battery is temporarily stopped.

For example, the battery may be charged for a predetermined charging time (or charging capacity), and the charging of the battery may be stopped for a predetermined resting period. The charging period and the resting period of the battery may be repeated until the voltage (or state of charge (SOC)) of the battery reaches a preset charging end voltage (or charging end SOC).

The measurement unit 110 may measure the voltage of the battery according to a preset voltage measurement cycle. The voltage measurement cycle may be preset such that the voltage is measured at a start point and an end point of the resting period.

Figure 2:
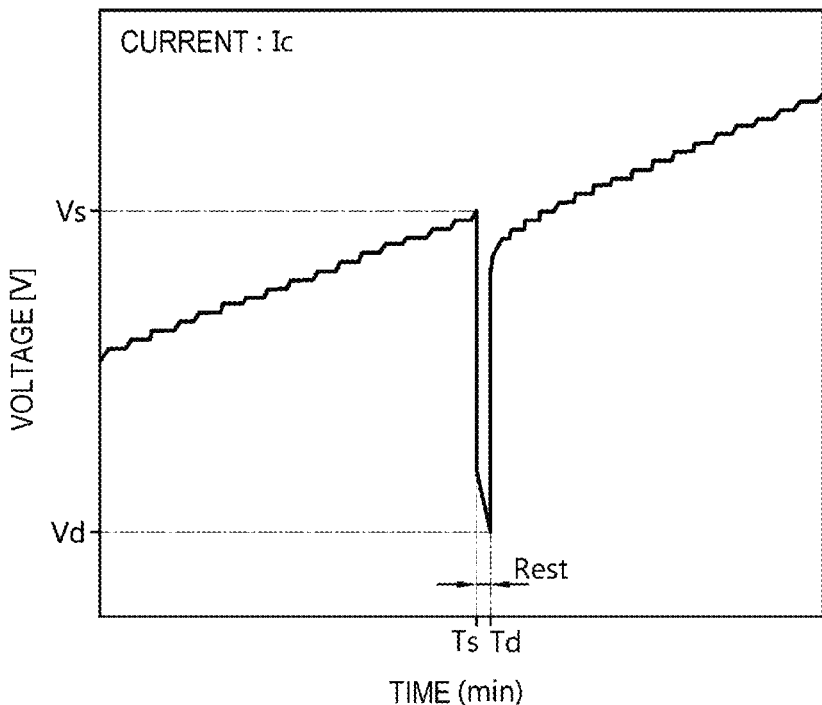
FIG. 2 is a diagram schematically illustrating a resting period of a battery according to an embodiment of the present disclosure.

FIG. 2 is a diagram schematically illustrating the resting period of the battery according to an embodiment of the present disclosure.

In the embodiment of FIG. 2, the battery is charged at a time before Ts, and the charging current is Ic. The time before Ts is the charging period of the battery. Afterwards, the charging of the battery may be stopped from the time Ts to the time Td. The time from the time Ts to the time Td is the resting period of the battery. The battery is charged at a time after Td, and the charging current is Ic. The time after Td is the charging period of the battery.

The control unit 120 may be configured to calculate the resistance corresponding to each of a plurality of resting periods.

For example, the control unit 120 may calculate the resistance of the battery based on a voltage drop during the resting period. Since the application of the charging current is stopped during the resting period, the voltage of the battery may decrease. Afterwards, when the charging is restarted, the voltage of the battery may increase again. The control unit 120 may calculate the resistance value corresponding to the resting period depending on the amount of the voltage drop during the resting period. For example, the control unit 120 may calculate the resistance value of the battery according to the Ohm's law.

For example, in the embodiment of FIG. 2, the voltage of the battery may decrease from Vs[V] to Vd[V] during the resting period. The control unit 120 may calculate the resistance of the battery by calculating the equation of "(Vs−Vd)÷Ic".

The charging process of the battery may include one or more resting periods. The control unit 120 may calculate the resistance corresponding to each of the one or more resting periods. For example, when the charging process of the battery includes n resting periods (e.g., n is a natural number equal to or greater than 1), the control unit 120 may calculate n resistances.

The control unit 120 may be configured to generate a first profile P1 indicating a correspondence relationship between the SOC and the resistance of the battery.

For example, the control unit 120 may generate the first profile P1 indicating a correspondence relationship between the SOC and the resistance corresponding to each resting period.

The control unit 120 may determine the state of charge (SOC) corresponding to the starting voltage of the resting period as an SOC corresponding to the resting period. The control unit 120 may estimate the SOC corresponding to the resting period by referring to an SOC-voltage profile that has been preset to indicate a correspondence relationship between the SOC and the voltage. Then, the control unit 120 may map the calculated resistance corresponding to the resting period and the estimated SOC.

For example, in the embodiment of FIG. 2, the control unit 120 may estimate the SOC corresponding to Vs[V], based on the SOC-voltage profile. Then, the control unit 120 may map the estimated SOC and the calculated resistance to each other.

Figure 3:
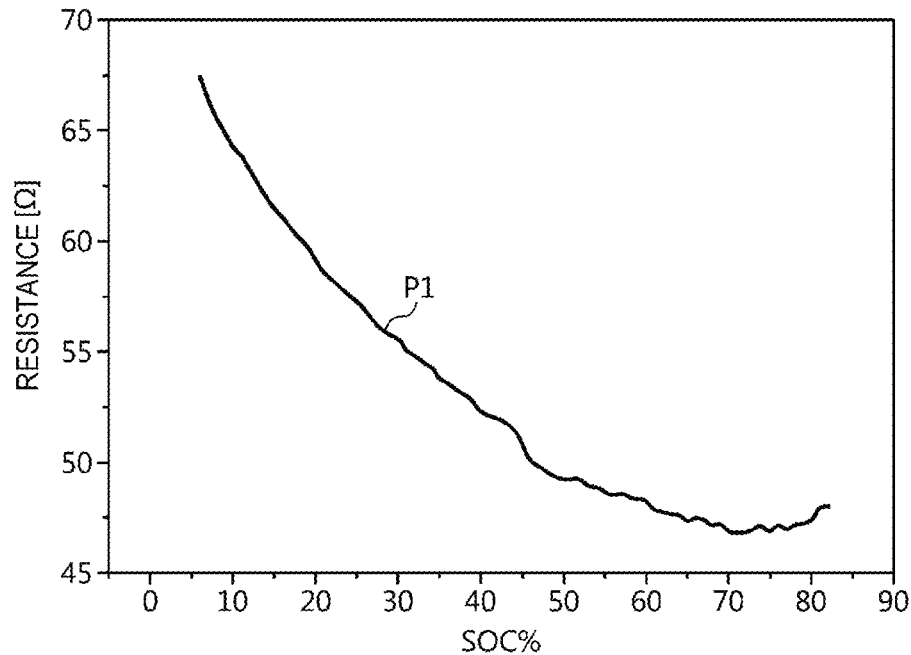
FIGS. 3 and 4 are diagrams schematically illustrating a first profile according to an embodiment of the present disclosure.
Figure 4:
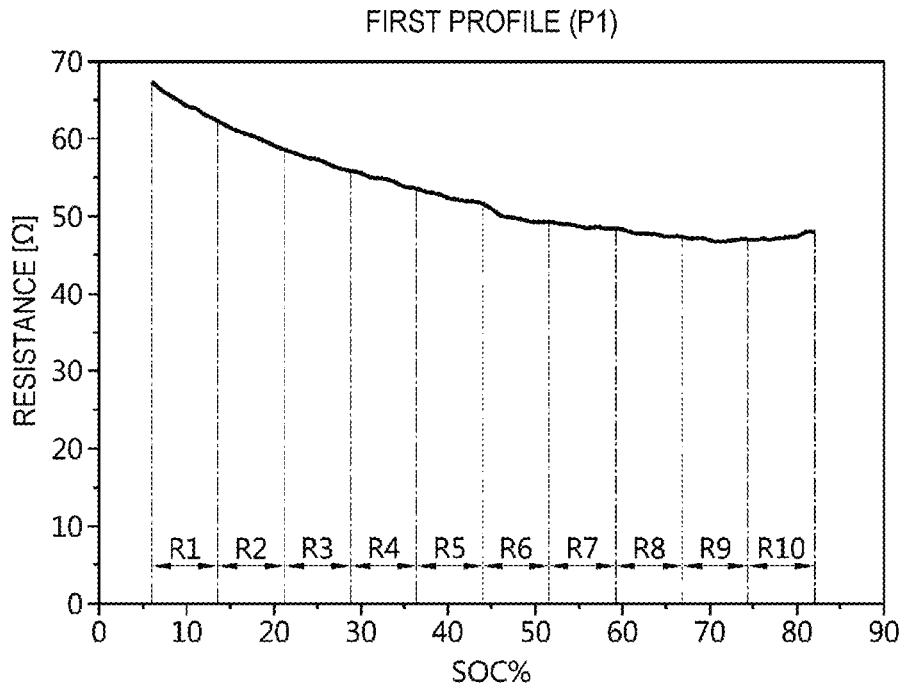

FIGS. 3 and 4 are diagrams schematically illustrating the first profile P1 according to an embodiment of the present disclosure. The first profile P1 may be expressed as an X-Y graph in which an X-axis is set to the SOC and a Y-axis is set to the resistance.

FIG. 3 illustrates the resistance and the first profile P1 calculated by the control unit 120. Since the control unit 120 calculates the resistance corresponding to each of the plurality of resting periods, the calculated resistances may be discontinuous. Therefore, the control unit 120 may generate the first profile P1, which is a continuous regression curve for a plurality of resistances, by using a regression model. In the first profile P1, the resistance may be expressed as a function of SOC (e.g., resistance=f(SOC)).

The control unit 120 may be configured to divide the SOC section of the first profile P1 into a plurality of unit sections.

For example, it is assumed that the charging start SOC of the battery is SOCi, the charging end SOC of the battery is SOCf, and the control unit 120 divides the SOC section into m unit sections (e.g., m is a natural number equal to or greater than 2). The sizes of the unit sections may all be the same. The SOC section of the first profile P1 ranges from SOCi to SOCf. The control unit 120 divides the SOC section into m unit sections, and the size of each unit section may be calculated as "(SOCf−SOCi)÷m".

In the embodiment of FIG. 4, the control unit 120 may divide the SOC section of the first profile P1 into 10 unit sections. The SOC section of the first profile P1 is divided into first to tenth unit sections R1 to R10, and the sizes of the plurality of unit sections R1 to R10 are all the same.

The control unit 120 may be configured to calculate the summed resistance of the battery based on the weights and the reference resistances corresponding to each of the plurality of unit sections.

For example, the control unit 120 may be configured to select any one resistance included in each of the plurality of unit sections as the reference resistance. The control unit 120 may be configured to apply a condition for selecting a reference resistance for the unit section to the plurality of unit sections in the same manner. For example, the control unit 120 may select the resistance corresponding to the start SOC, the end SOC, or the intermediate SOC of the unit section, as a reference resistance of the corresponding unit section. As another example, the control unit 120 may select a maximum resistance, a minimum resistance, an intermediate resistance, or an average resistance of the unit section, as a reference resistance.

In addition, the control unit 120 may be configured to calculate the summed resistance by summing the product of the reference resistance and the weight of each of the plurality of unit sections. The weight may be set to correspond to each of the plurality of unit sections.

Since the sizes of the plurality of unit sections are all the same, the weight may be set based on the resistance (e.g., the unit resistance) included in each of the plurality of unit sections. The sum of the weights for the plurality of unit sections may be 1 or 100%. For example, in the embodiment of FIG. 4, the control unit 120 may set the weights for each of the first to tenth unit sections R1 to R10. Here, the total sum of the weights set for the first to tenth unit sections R1 to R10 may be 1 or 100%.

Then, the control unit 120 may calculate the equation of "reference resistance×weight" for each of the plurality of unit sections, and sum up all the calculated values to calculate the summed resistance for the battery. Since the calculated summed resistance is a representative resistance value for the first profile P1 of the battery, it may be used as a resistance indicator for the first profile P1 of the battery.

FIG. 5 is a diagram schematically illustrating an embodiment of calculating the summed resistance corresponding to the first profile P1.

In the embodiment of FIG. 5, the unit resistance of the first unit section R1 is a1 [Ω], the weight of the first unit section R1 is w1, and the reference resistance of the first unit section R1 is r1 [Ω]. The unit resistance of the second unit section R2 is a2 [Ω], the weight of the second unit section is w2, and the reference resistance of the second unit section is r2 [Ω]. The unit resistance of the third unit section R3 is a3 [Ω], the weight of the third unit section R3 is w3, and the reference resistance of the third unit section R3 is r3 [Ω]. The unit resistance of the fourth unit section R4 is a4 [Ω], the weight of the fourth unit section R4 is w4, and the reference resistance of the fourth unit section R4 is r4 [Ω]. The unit resistance of the fifth unit section R5 is a5 [Ω], the weight of the fifth unit section R5 is w5, and the reference resistance of the fifth unit section R5 is r5 [Ω]. The unit resistance of the sixth unit section R6 is a6 [Ω], the weight of the sixth unit section R6 is w6, and the reference resistance of the sixth unit section R6 is r6 [Ω]. The unit resistance of the seventh unit section R7 is a7 [Ω], the weight of the seventh unit section R7 is w7, and the reference resistance of the seventh unit section R7 is r7 [Ω]. The unit resistance of the eighth unit section R8 is a8 [Ω], the weight of the eighth unit section R8 is w8, and the reference resistance of the eighth unit section R8 is r8 [Ω]. The unit resistance of the ninth unit section R9 is a9 [Ω], the weight of the ninth unit section R9 is w9, and the reference resistance of the ninth unit section R9 is r9 [Ω]. The unit resistance of the tenth unit section R10 is a10 [Ω], the weight of the tenth unit section R10 is w10, and the reference resistance of the tenth unit section R10 is r10 [Ω]. The control unit 120 may multiply the weight and the reference resistance of each of the first to tenth unit sections R1 to R10, and add up all of the multiplied values to calculate the summed resistance.

The battery managing apparatus 100 according to an embodiment of the present disclosure is characterized by determining the resistance indicator representing the battery according to the weight and the reference resistance of each of the plurality of unit sections. According to the present disclosure, since the resistance indicator of the battery is determined based on the first profile P1 acquired during the charging process, the state of the battery may be determined in various aspects through the absolute comparison or the relative comparison of the determined resistance indicator. In addition, since a single value called the summed resistance is calculated according to a set routine, the consistency in deriving the resistance indicator indicating the state of the battery may be guaranteed.

Meanwhile, the control unit 120 included in the battery managing apparatus 100 may selectively include a processor, an application-specific integrated circuit (ASIC), a chipset, a logic circuit, a register, a communication modem, and a data processing device, which have been known in the art to execute various control logics performed in the present disclosure. In addition, when the control logic is implemented as software, the control unit 120 may be implemented as a set of program modules. The program modules may be stored in a memory and executed by the control unit 120. The memory may be located inside or outside the control unit 120, and may be connected to the control unit 120 by various means well-known in the art.

In addition, the battery managing apparatus 100 may further include a storage unit 130. The storage unit 130 may store data or programs necessary for each component of the battery managing apparatus 100 to perform operations and functions, or data generated in the process of performing the operations and functions. The type of the storage unit 130 is not particularly limited as long as it is an information storage means that has been known to be able to record, erase, update, and read data. For example, the information storage means may include a random-access memory (RAM), a flash memory, a read-only memory (ROM), an electronically erasable programmable read-only memory (EEPROM), and a register. In addition, the storage unit 130 may store program codes in which processes executable by the control unit 120 are defined.

For example, the storage unit 130 may store information regarding the voltage of the battery measured by the measurement unit 110. In addition, the storage unit 130 may store the resistance value for each resting period calculated by the control unit 120 and the first profile P1 generated by the control unit 120.

Hereinafter, an embodiment will be described, in which the control unit 120 calculates the weight for each unit section.

The control unit 120 may be configured to calculate the entire resistance for the SOC section and the unit resistance for each of the plurality of unit sections.

For example, the control unit 120 may calculate the entire resistance by calculating the area of the SOC section. According to an embodiment, the control unit 120 may calculate the entire resistance by integrating the SOC section with respect to the SOC. The control unit 120 may calculate the entire resistance by calculating the total sum of resistances for the SOC section. For example, in the embodiments of FIGS. 4 and 5, the control unit 120 may calculate the entire resistance (A [Ω]) by integrating the first profile P1 with respect to the SOC.

The control unit 120 may calculate the unit resistance of each of the plurality of unit sections by calculating the area of each of the plurality of unit sections. For example, the control unit 120 may calculate the unit resistance of each of the plurality of unit sections by integrating each of the plurality of unit sections with respect to the SOC. For example, in the embodiments of FIGS. 4 and 5, the control unit 120 may calculate the unit resistance of the first unit section R1 as a1 [Ω], calculate the unit resistance of the second unit section R2 as a2 [Ω], and calculate the unit resistance of the third unit section R3 as a3 [Ω]. The control unit 120 may calculate the unit resistance of the fourth unit section R4 as a4 [Ω], calculate the unit resistance of the fifth unit section R5 as a5 [Ω], and calculate the unit resistance of the sixth unit section R6 as a6 [Ω]. The control unit 120 may calculate the unit resistance of the seventh unit section R7 as a7 [Ω], calculate the unit resistance of the eighth unit section R8 as a8 [Ω], calculate the unit resistance of the ninth unit section R9 as a9 [Ω], and calculate the unit resistance of the tenth unit section R10 as a10 [Ω].

The control unit 120 may be configured to calculate the weight corresponding to each of the plurality of unit sections based on the entire resistance and the plurality of calculated unit resistances.

For example, the control unit 120 may be configured to calculate the weights corresponding to each of the plurality of unit sections by calculating the ratios of each of the plurality of unit resistances to the entire resistance. For example, when the entire resistance is A and the unit resistance of an n-th unit section is an, the control unit 120 may calculate the equation of "an÷A", and calculate the weight wn for the n-th unit section.

For example, in the embodiments of FIGS. 4 and 5, the control unit 120 may calculate the ratios of each of the unit resistances a1 [Ω] to a10 [Ω] of the first to tenth unit sections R1 to R10 to the entire resistance A [Ω], and calculate the weights of w1 to w10. The weight of the first unit section R1 is w1, the weight of the second unit section R2 is w2, and the weight of the third unit section R3 is w3. The weight of the fourth unit section R4 is w4, the weight of the fifth unit section R5 is w5, and the weight of the sixth unit section R6 is w6. The weight of the seventh unit section R7 is w7, the weight of the eighth unit section R8 is w8, the weight of the ninth unit section R9 is w9, and the weight of the tenth unit section R10 is w10.

The control unit 120 may multiply the weight and the reference resistance for each unit section, and add up all of the multiplied values to calculate the summed resistance corresponding to the first profile P1.

Then, the control unit 120 may be configured to compare the calculated and summed resistance with a preset threshold resistance.

The summed resistance is a resistance indicator indicating the state of the battery and is calculated as a single value.

Therefore, the control unit 120 may compare the sizes of the summed resistance and the preset threshold resistance. The threshold resistance is a reference value capable of distinguishing the state of the battery as a normal state or an abnormal state based on the resistance of the battery, and may be preset experimentally or theoretically in consideration of the type, the specification, and the degradation degree of the battery.

The control unit 120 may be configured to diagnose the state of the battery based on a comparison result.

For example, when the summed resistance exceeds the threshold resistance, the control unit 120 may diagnose the state of the battery as an abnormal state. As another example, when the summed resistance is less than or equal to the threshold resistance, the control unit 120 may diagnose the state of the battery as a normal state.

Meanwhile, the control unit 120 may calculate the summed resistances for a plurality of batteries. Then, the control unit may be configured to compare the calculated and summed resistances, and determine the relative performances of the plurality of batteries.

For example, the control unit 120 may calculate and compare the summed resistances for batteries charged with the same C-rate. Since the summed resistances of the batteries also change when the C-rate changes, the summed resistances at different C-rates may not be compared with each other. Therefore, in order to compare the summed resistances, the summed resistances of the batteries charged with the same C-rate may be compared to each other.

Since the internal resistance of the battery increases when the battery is degraded, the summed resistance at each C-rate also increases due to the effect of the increased internal resistance. In addition, since the degradation degree and performance are inversely proportional, the performance of the battery is lowered in accordance with the degradation of the battery. Therefore, the control unit 120 may determine the relative performances of a plurality of batteries based on a comparison result of the summed resistances thereof.

For example, the control unit 120 may determine that the performance of the battery with a maximum summed resistance is the worst, and the performance of the battery with a minimum summed resistance is the best.

The control unit 120 may be configured to calculate the summed resistance at each C-rate during the charging process of the battery.

According to an embodiment, in order to calculate the summed resistance at each C-rate of the battery, the C-rate may not be changed during the charging process of the battery. The control unit 120 may calculate the summed resistance to correspond to the first profile P1 acquired during each charging process.

For example, when the battery is charged at 0.33 C, 0.5 C, 0.7 C, 1 C, 1.5 C, 2 C, and 2.5 C, the control unit 120 may calculate summed resistances corresponding to each of C-rates. For example, the control unit 120 may calculate seven summed resistances.

The control unit 120 may be configured to generate a second profile indicating a correspondence relationship between the C-rate and the summed resistance. For example, the second profile may be expressed as an X-Y graph in which an X-axis is set to the C-rate and a Y-axis is set to the summed resistance.

The control unit 120 may be configured to generate a second profile for each of the plurality of batteries.

Figure 6:
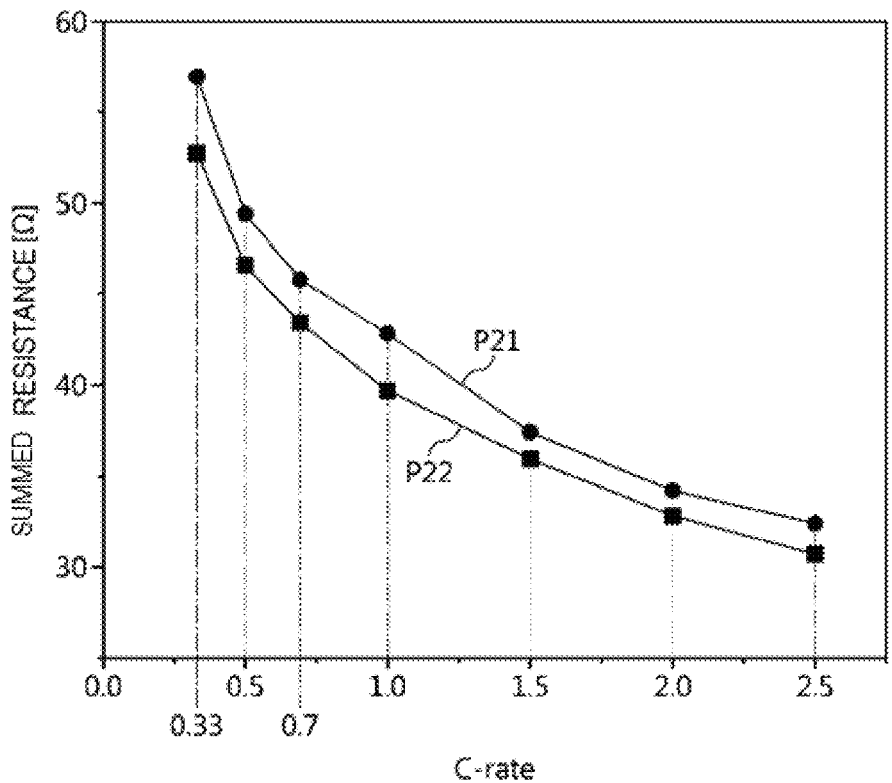
FIG. 6 is a diagram schematically illustrating second profiles according to an embodiment of the present disclosure.

FIG. 6 is a diagram schematically illustrating second profiles according to an embodiment of the present disclosure. FIG. 6 is a diagram illustrating a second profile P21 for a first battery and a second profile P22 for a second battery.

For example, in the embodiment of FIG. 6, the control unit 120 may calculate the summed resistances of the first battery and the second battery at 0.33 C, 0.5 C, 0.7 C, 1 C, 1.5 C, 2 C, and 2.5 C, and generate the second profile P21 for the first battery and the second profile P22 for the second battery based on the calculated and summed resistances. In addition, the control unit may generate the second profile, which is a continuous regression curve for a plurality of summed resistances, by using a regression model.

The control unit 120 may be configured to compare the summed resistances at each C-rate of the plurality of second profiles, and determine the relative performances of the plurality of batteries.

The control unit 120 may compare the summed resistances at each C-rate of the plurality of batteries, and determine the relative performances of the plurality of batteries at each C-rate. The relative performance is an indicator for relatively evaluating performances such as charging/discharging efficiency or output efficiency. As the summed resistance increases, the loss due to the resistance increases. Thus, it may be said that a battery with a better relative performance has a superior charging/discharging efficiency (or output efficiency) compared to the remaining batteries.

For example, at a first C-rate, when the summed resistance of battery A is greater than the summed resistance of battery B, the control unit 120 may determine that the performance of battery B is superior to that of battery A at the first C-rate. For example, the control unit 120 may determine that battery B can exhibit a better performance than battery A at the first C-rate.

For example, in the embodiment of FIG. 6, the summed resistances of the first battery are greater than the summed resistances of the second battery at all of the C-rates. Therefore, the control unit 120 may determine that the performance of the second battery is superior to the performance of the first battery at all the C-rates.

The battery managing apparatus 100 according to an embodiment of the present disclosure may determine the relative performances of a plurality of batteries by comparing the summed resistances thereof at each C-rate. According to the present disclosure, the performances of the batteries at each C-rate may be compared and determined.

For example, when there is provided an environment where battery replacement is possible, such as a battery swap station (BSS), a battery most suitable for a user's usage environment (e.g., a commonly used C-rate, recommended C-rate, or allowed maximum C-rate) may be employed based on a determination result of the relative performance thereof. According to the present disclosure, the usage efficiency of the battery may be improved.

The battery managing apparatus 100 according to the present disclosure may be applied to a battery management system (BMS). The BMS according to the present disclosure may include the battery managing apparatus 100 described above. In this configuration, at least some of respective components of the battery managing apparatus 100 may be implemented by supplementing or adding the functions of components included in a conventional BMS. For example, the measurement unit 110, the control unit 120, and the storage unit 130 of the battery managing apparatus 100 may be implemented as components of the BMS.

In addition, the battery managing apparatus 100 according to the present disclosure may be provided in a battery pack. For example, the battery pack according to the present disclosure may include the battery managing apparatus 100 described above and one or more battery cells. In addition, the battery pack may further include electrical components (e.g., a relay and a fuse) and a case.

Figure 7:
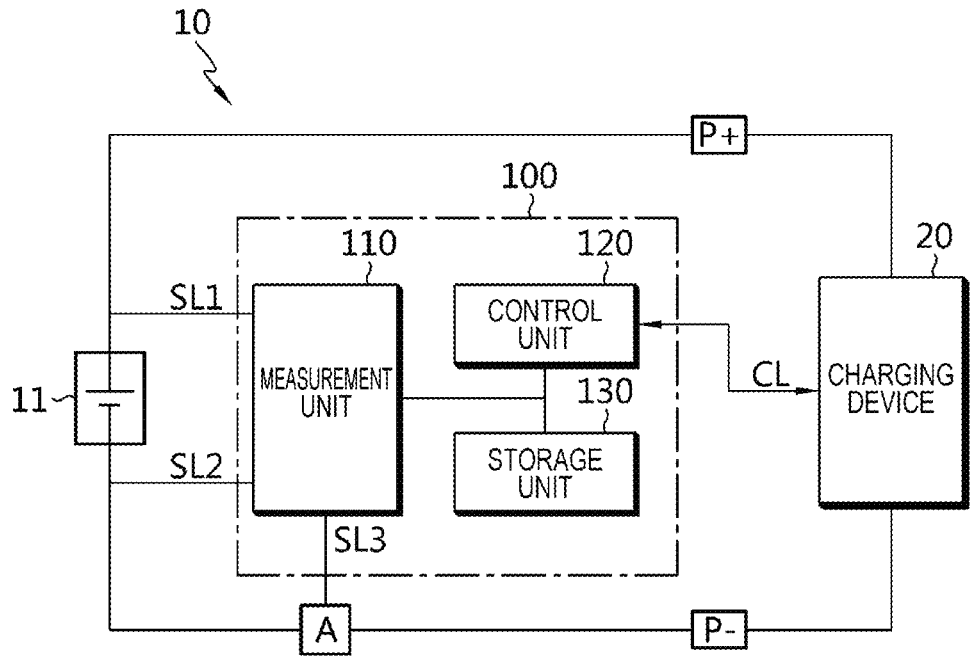
FIG. 7 is a diagram schematically illustrating a battery pack according to another embodiment of the present disclosure.

FIG. 7 is a diagram schematically illustrating a battery pack according to another embodiment of the present disclosure.

A positive terminal of a battery 11 may be connected to a positive terminal P+ of a battery pack 10, and a negative terminal of the battery 11 may be connected to a negative terminal P− of the battery pack 10.

The measurement unit 110 may be connected to a first sensing line SL1, a second sensing line SL2, and a third sensing line SL3. For example, the measurement unit 110 may be connected to the positive terminal of the battery 11 through the first sensing line SL1, and connected to the negative terminal of the battery 11 through the second sensing line SL2. The measurement unit 110 may measure the voltage of the battery 11 based on the voltage measured from each of the first sensing line SL1 and the second sensing line SL2.

The measurement unit 110 may be connected to a current measurement unit A through the third sensing line SL3. For example, the current measurement unit A may be an ammeter or a shunt resistor capable of measuring a charging current and a discharging current of the battery 11. The measurement unit 110 may measure the charging current of the battery 11 through the third sensing line SL3, and calculate a charging amount. In addition, the measurement unit 110 may measure the discharging current of the battery 11 through the third sensing line SL3, and calculate a discharging amount.

An external device may be connected to the positive terminal P+ and the negative terminal P− of the battery pack 10. The positive terminal of the battery 11, the positive terminal P+ of the battery pack 10, the external device, the negative terminal P− of the battery pack 10, and the negative terminal of the battery 11, may be electrically connected to one another.

For example, a charging device 20 may be connected to the positive terminal P+ and the negative terminal P− of the battery pack 10. Here, the charging device 20 is a device for charging the battery 11.

The control unit 120 may be communicatively connected to the charging device 20 through a communication line CL in a wired and/or wireless manner. For example, the control unit 120 may perform the power-line communication (PLC) with the charging device 20.

For example, the control unit 120 may command the charging device 20 to perform the charging and resting thereof such that a charging period and a resting period are repeated under a preset certain condition.

As another example, a charging protocol that repeats the charging period and the resting period may be preset in the charging device 20. The charging device 20 charges a battery according to the charging protocol, and the control unit 120 may calculate the summed resistance of the battery based on a measurement result.

Figure 8:
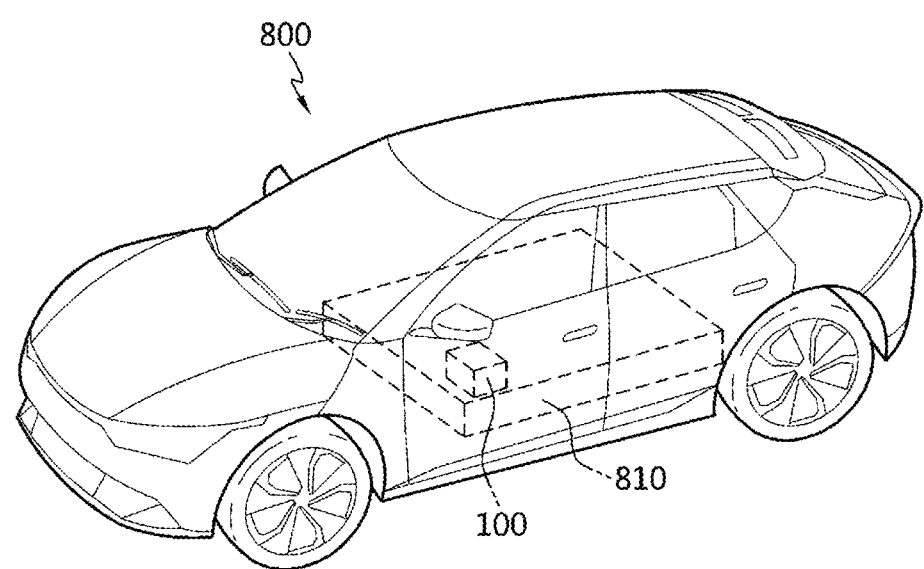
FIG. 8 is a view schematically illustrating a vehicle according to sill another embodiment of the present disclosure.

FIG. 8 is a view schematically illustrating a vehicle 800 according to still another embodiment of the present disclosure.

Referring to FIG. 8, a battery pack 810 according to the embodiment of the present disclosure may be included in the vehicle 800 such as an electric vehicle (EV) or a hybrid vehicle (HV). The battery pack 810 may drive the vehicle 800 by supplying power to the motor of the vehicle through an inverter equipped in the vehicle 800. Here, the battery pack 810 may include the battery managing apparatus 100. For example, the vehicle 800 may include the battery managing apparatus 100. In this case, the battery managing apparatus 100 may be an on-board device included in the vehicle 800.

Figure 9:
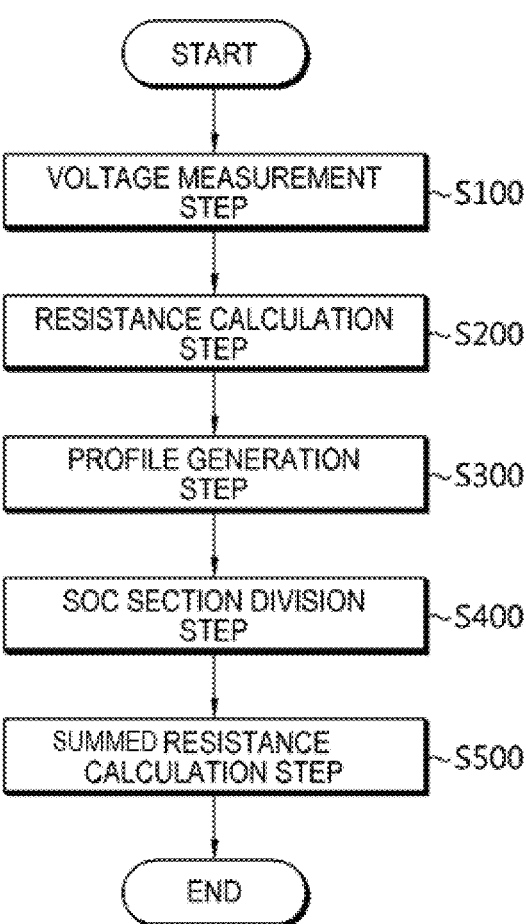
FIG. 9 is a diagram schematically illustrating a battery managing method according to still another embodiment of the present disclosure.

FIG. 9 is a diagram schematically illustrating a battery managing method according to still another embodiment of the present disclosure.

Referring to FIG. 9, the battery managing method may include a voltage measurement step S100, a resistance calculation step S200, a profile generation step S300, an SOC section division step S400, and a summed resistance calculation step S500.

Each step of the battery managing method may be performed by the battery managing apparatus 100. Hereinafter, for the convenience of explanation, the contents that overlap with the aforementioned contents will be omitted or briefly described.

The voltage measurement step S100 is a step of measuring the voltage of the battery that is charged by repeating the charging period and the resting period, and may be performed by the measurement unit 110.

For example, the battery may be charged for a predetermined charging time (or a charging capacity), and the charging of the battery may be stopped for a predetermined resting period. The measurement unit 110 may measure the voltage of the battery according to a preset voltage measurement cycle. According to an embodiment, the voltage measurement cycle may be preset such that the voltage is measured at the start point and the end point of the resting period.

The resistance calculation step S200 is a step of calculating the resistance corresponding to each of a plurality of resting periods, and may be performed by the control unit 120.

For example, the control unit 120 may calculate the resistance of the battery based on the voltage drop during the resting period. For example, in the embodiment of FIG. 2, the voltage of the battery may decrease from Vs[V] to Vd[V] during the resting period. The control unit 120 may calculate the resistance of the battery by calculating the equation of "$(Vs-Vd) \div Ic$".

The profile generation step S300 is a step of generating a first profile P1 indicating a correspondence relationship between the SOC and the resistance of the battery, and may be performed by the control unit 120.

For example, the control unit 120 may generate the first profile P1 indicating a correspondence relationship between the SOC and the resistance corresponding to each resting period. For example, FIGS. 3 and 4 are diagrams schematically illustrating the first profile P1 according to an embodiment of the present disclosure.

The SOC section division step S400 is a step of dividing the SOC section of the first profile P1 into a plurality of unit sections, and may be performed by the control unit 120.

For example, the control unit 120 may divide the SOC section of the first profile P1 into two or more unit sections.

The summed resistance calculation step S500 is a step of calculating the summed resistance of the battery based on the weights and resistances corresponding to each of the plurality of unit sections, and may be performed by the control unit 120.

For example, the control unit 120 may be configured to select any one resistance included in each of the plurality of unit sections as a reference resistance. In addition, the control unit 120 may be configured to calculate the entire resistance for the SOC section and the unit resistance for each of the plurality of unit sections. Furthermore, the control unit 120 may be configured to calculate the weights corresponding to each of the plurality of unit sections by calculating the ratios of each of the plurality of unit resistances to the entire resistance. Finally, the control unit 120 may be configured to calculate the summed resistance by adding up the product of the reference resistance and the weight of each of the plurality of unit sections.

The embodiments of the present disclosure described above are implemented not only through the apparatus and method, but also through a program that implements functions corresponding to the configurations of the embodiments of the present disclosure, or a recording medium in which the program is recorded. The implementation may be readily implemented by an expert in the technical field to which the present disclosure belongs, from the description of the embodiments of the present disclosure described above.

Although the present disclosure has been described above through limited embodiments and drawings, the present disclosure is not limited thereto, and it is obvious that various modifications and variations are possible within the scope of the technical idea of the present disclosure and the equivalent scope of the patent claims to be described below by an ordinary skill in the art to which the present disclosure belongs.

In addition, the present disclosure described above allows for various substitutions, modifications, and changes thereof within the scope of the technical idea of the present disclosure by an ordinary skill in the art to which the present disclosure belongs. Thus, the present disclosure is not limited by the aforementioned embodiments and attached drawings, but the entirety or part of each of the embodiments may be selectively combined and configured such that various modifications thereof may be made.

DESCRIPTION OF SYMBOLS

10: battery pack
11: battery
20: charging device
100: battery managing apparatus
110: measurement unit
120: control unit
130: storage unit
800: vehicle
810: battery pack

What is claimed is:

1. A battery managing apparatus comprising: a measurement unit configured to measure a voltage of a battery that is charged by repeating a charging period and a resting period; and a control unit configured to calculate a resistance of the battery corresponding to each of a plurality of resting periods, generate a first profile indicating a correspondence relationship between a state of charge (SOC) and the resistance of the battery, divide a SOC section of the first profile into a plurality of unit sections, and calculate a summed resistance of the battery based on a weight and a reference resistance corresponding to each of the plurality of unit sections, wherein the control unit is configured to calculate an entire resistance for the SOC section and a unit resistance for each of the plurality of unit sections, and calculate the weight corresponding to each of the plurality of unit sections based on the entire resistance and the plurality of calculated unit resistances.

2. The battery managing apparatus according to claim 1, wherein the control unit is configured to calculate the weight corresponding to each of the plurality of unit sections by calculating a ratio of each of the plurality of unit resistances to the entire resistance.

3. The battery managing apparatus according to claim 1, wherein the control unit is configured to select any one resistance included in each of the plurality of unit sections as the reference resistance, and calculate the summed resistance by summing a product of the reference resistance and the weight of each of the plurality of unit sections.

4. The battery managing apparatus according to claim 1, wherein the control unit is configured to compare the calculated and summed resistance with a preset threshold resistance, and diagnose a state of the battery based on a comparison result.

5. The battery managing apparatus according to claim 1, wherein the control unit is configured to calculate the summed resistance for each of a plurality of batteries, and compare the plurality of calculated and summed resistances to determine relative performances of the plurality of batteries.

6. The battery managing apparatus according to claim 5, wherein the control unit is configured to calculate the plurality of summed resistances when the plurality of batteries are charged at the same Current-rate (C-rate), and compare the plurality of calculated and summed resistances.

7. The battery managing apparatus according to claim 1, wherein the control unit is configured to calculate the summed resistance at each C-rate during a charging process of the battery, and generate a second profile indicating a correspondence relationship between the C-rate and the summed resistance.

8. The battery managing apparatus according to claim 7, wherein the control unit is configured to generate the second profile for each of a plurality of batteries, and compare summed resistances at each C-rate of the plurality of second profiles to determine relative performances of the plurality of batteries.

9. A battery pack including the battery managing apparatus according to claim 1.

10. A vehicle including the battery managing apparatus according to claim 1.

11. A battery managing method comprising: a voltage measurement step of measuring a voltage of a battery that is charged by repeating a charging period and a resting period; a resistance calculation step of calculating a resistance of the battery corresponding to each of a plurality of resting periods; a profile generation step of generating a first profile indicating a correspondence relationship between a state of charge (SOC) and the resistance of the battery; a SOC section division step of dividing a SOC section of the first profile into a plurality of unit sections; and a summed resistance calculation step of calculating a summed resistance of the battery based on a weight and a resistance corresponding to each of the plurality of unit sections, wherein an entire resistance for the SOC section and a unit resistance for each of the plurality of unit sections are calculated, and the weight corresponding to each of the plurality of unit sections is calculated based on the entire resistance and the plurality of calculated unit resistances.

12. A non-transitory computer-readable storage medium having stored therein a program for executing a battery managing method, the battery managing method including: a voltage measurement step of measuring a voltage of a battery that is charged by repeating a charging period and a resting period; a resistance calculation step of calculating a resistance of the battery corresponding to each of a plurality of resting periods; a profile generation step of generating a first profile indicating a correspondence relationship between a state of charge (SOC) and the resistance of the battery; a SOC section division step of dividing a SOC section of the first profile into a plurality of unit sections; and a summed resistance calculation step of calculating a summed resistance of the battery based on a weight and a resistance corresponding to each of the plurality of unit sections, wherein an entire resistance for the SOC section and a unit resistance for each of the plurality of unit sections are calculated, and the weight corresponding to each of the plurality of unit sections is calculated based on the entire resistance and the plurality of calculated unit resistances.

\* \* \* \* \*